United States Patent [19]

Sharma et al.

[11] Patent Number: 4,575,745

[45] Date of Patent: Mar. 11, 1986

[54] TAILORABLE STANDARD CELLS AND METHOD FOR TAILORING THE PERFORMANCE OF IC DESIGNS

[75] Inventors: Shanti S. Sharma, Maple Shade; Fred Borgini, Haddonfield, both of N.J.

[73] Assignee: RCA Corporation, Princeton, N.J.

[21] Appl. No.: 506,379

[22] Filed: Jun. 21, 1983

[51] Int. Cl.[4] .................. H01L 27/10; H01L 23/50
[52] U.S. Cl. ............................... 357/45; 357/42; 357/68
[58] Field of Search .............. 357/42, 45, 40, 68

[56] References Cited

U.S. PATENT DOCUMENTS 4,021,838  5/1977  Warwick ........................ 357/68
4,412,237 10/1983  Matsumura et al. ............ 357/41

Primary Examiner—William D. Larkins
Assistant Examiner—E. Fallick
Attorney, Agent, or Firm—Joseph S. Tripoli; Robert L. Troike; Robert Ochis

[57] ABSTRACT

The inclusion of split power buses in standard cells enables the modification of IC performance through separate control over the width of the power bus and the size of active devices within the cell. This allows problems such as excessive voltage drop on power buses, insufficient power handling capability within the cell, excessive current consumption within the cell and so forth, to be corrected without major redesign of the cells or the IC.

4 Claims, 10 Drawing Figures

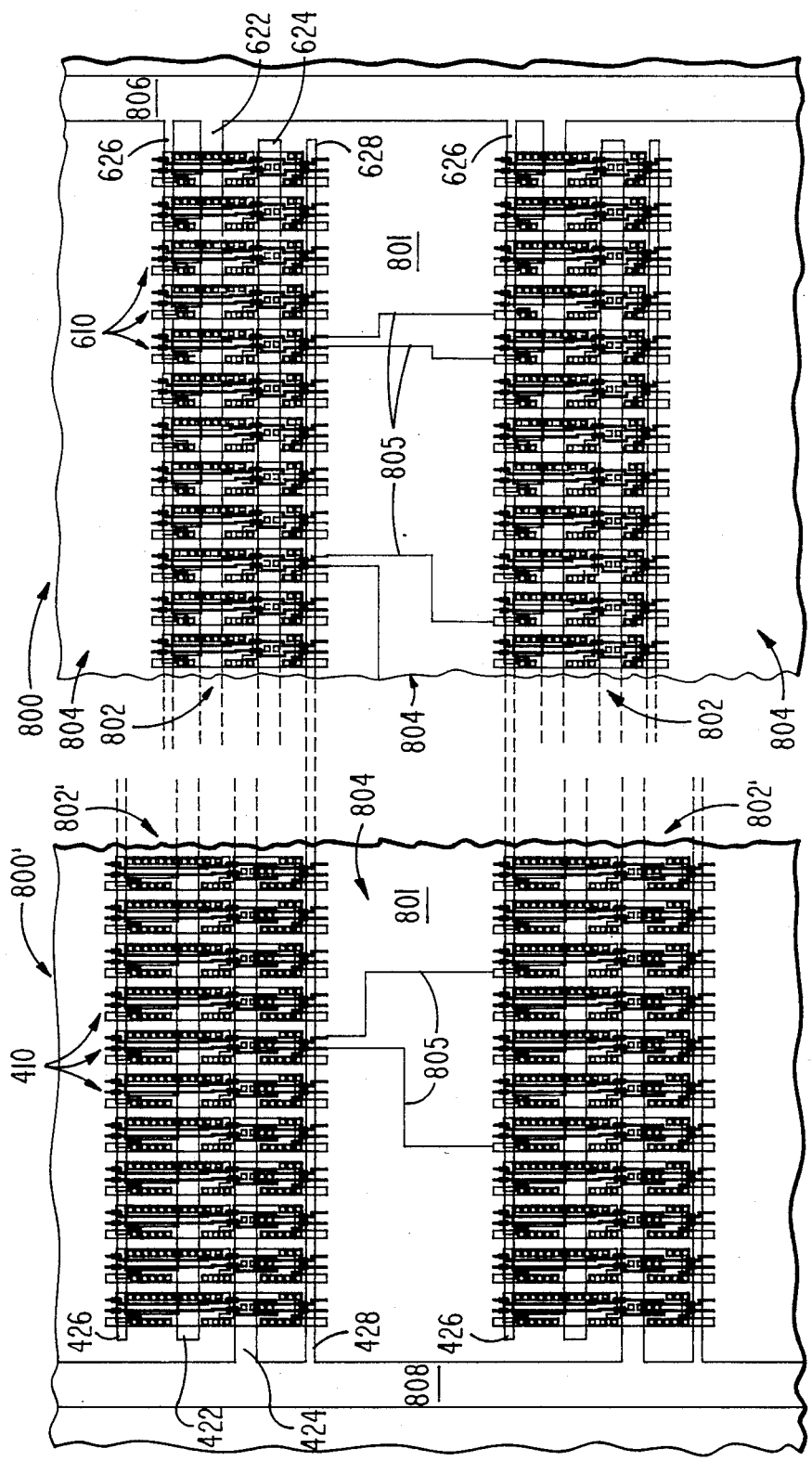

TAILORABLE STANDARD CELLS AND METHOD FOR TAILORING THE PERFORMANCE OF IC DESIGNS

The U.S. Government has rights in this invention persuant to Contract No. DAAK-20-81-C-0402 awarded by the Department of the Army.

The present invention relates to the field of integrated circuits (ICs) and more particularly to the field of high-performance ICs.

To facilitate rapid design, logic functions of an IC are sometimes implemented using standard cells which are predesigned to provide specified logic functions.

A high-performance IC requiring a specified speed and reliability may not meet those requirements, when designed using a given standard cell family. This problem is particularly acute where the standard cell family is designed from scratch to provide the performance specified for that IC. Lack of operational experience with that family of standard cells during design of that family makes accurate performance predictions very difficult. Some of the possible problems with such an IC are: excessive voltage drops on power buses, excessive-amplitude current transients on signal lines, cell current-handling-capacity which is insufficient to provide the required performance, insufficient speed, inadequate margins for the required reliability, inability to adjust to improved technology and so forth. It is unlikely that all of these problems will occur in a single IC. However, prevention of all of them during the design of a new standard cell family is improbable because competing design considerations are involved. Occasionally, one of these problems may be overcome by altering the location of selected cells within the IC itself. However, in most cases these problems, if present, can only be overcome by extensive, time consuming redesign of the cell family or the design of a new cell family.

There is a need for a technology which ensures that whichever of these problems arises, it can be cured by a rapid modification of the cells which does not involve time consuming redesign of the cells or of the integrated circuit itself.

The present invention provides such a technology by providing independent control over the width of the cell power bus(es) and the size of active devices in the cell. In accordance with one preferred embodiment, control over the bus width is provided by the use of split power buses in which each of the cell row power buses has inner and outer segments. The width of active devices in the cell is changed by stretching or contracting a portion of the cell. This enables the performance of the IC to be tailored by separately modifying the widths of buses and the widths of active devices within the cells of the IC to provide the desired level of performance.

BRIEF DESCRIPTION OF THE DRAWINGS

FIG. 9A illustrates a portion of an IC in accordance with the invention in which the cells have been contracted; and FIG. 9B illustrates a portion of the same IC in which the cells have been stretched.

FIG. 1 is a schematic diagram of a four transistor, two-input, CMOS NOR gate 10. The gate 10 has been used in some prior art standard cell families. Two PMOS transistors, $T_1$ and $T_2$, are connected in series between a source of a relatively positive voltage $V_1$ and a logical output terminal L. Two NMOS transistors, $T_3$ and $T_4$, are connected in parallel between terminal L and a source of a relatively negative voltage $V_2$. The gates of $T_1$ and $T_3$ are connected in common to a first input terminal $G_1$. The gates of $T_2$ and $T_4$ are connected in common to a second input terminal $G_2$. The standard cells which illustrate the prior art and the present invention in this specification are embodiments of the NOR gate 10.

Figure 1:
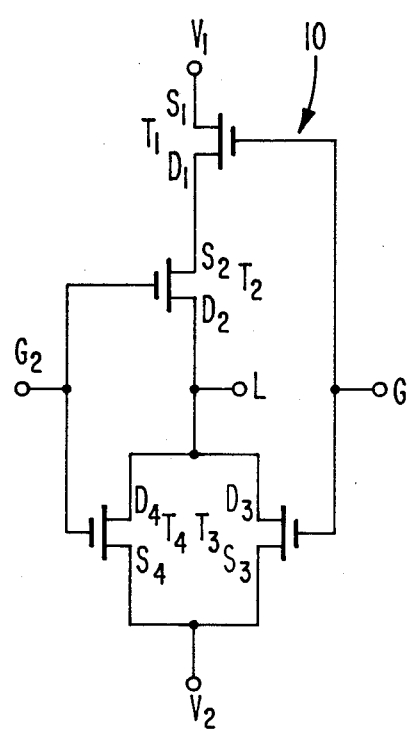
FIG. 1 is a schematic diagram of a prior art two-input NOR gate.
Figure 2:
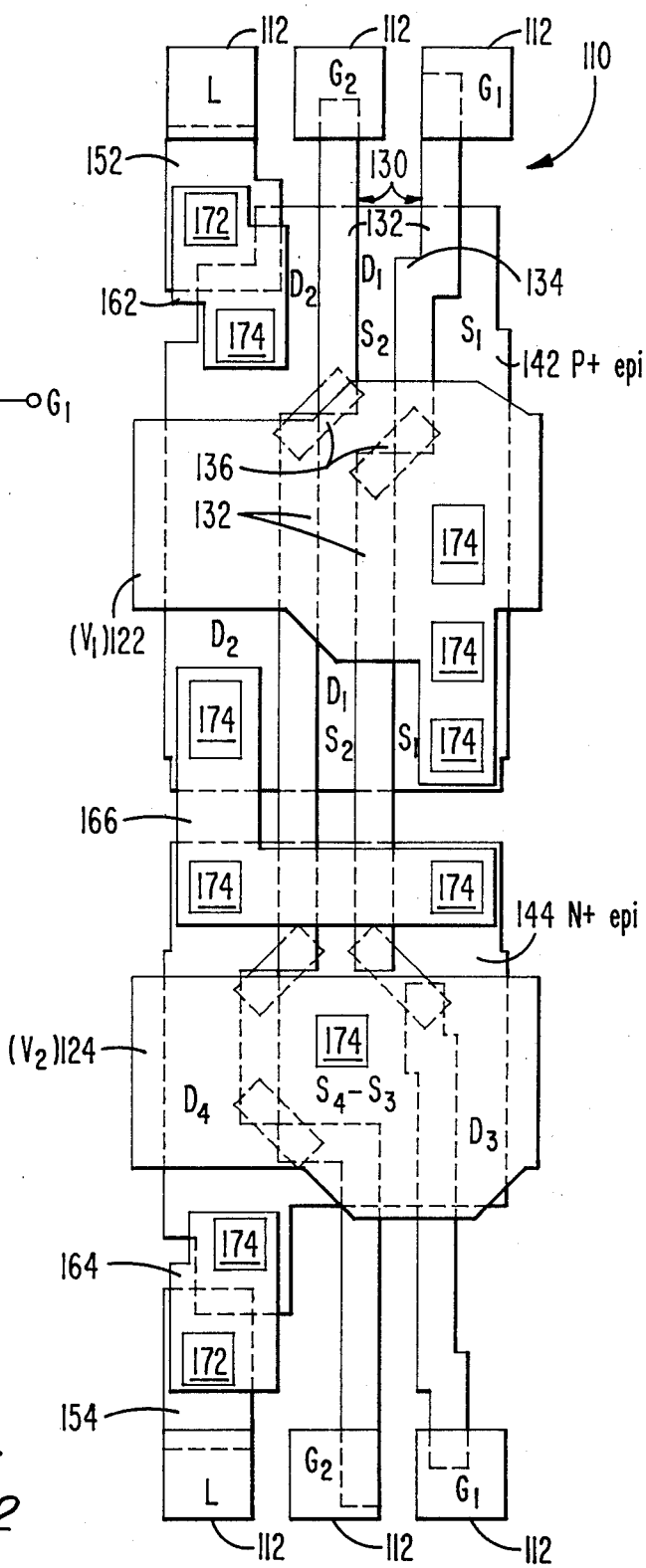
FIG. 2 illustrates a prior art two-input NOR gate cell.

NOR gate 10 is embodied in a prior art cell 110 in FIG. 2. Cell 110 is shown in a check plot form. Cell 110 contains two levels of interconnections—a lower one of polycrystalline silicon or polysilicide (poly) and an upper one of metal. The cell 110 has contact pin pads 112 of poly along its upper and lower boundaries. These pads are the terminals $G_1$, $G_2$ and L of NOR gate 10 to which external-to-the-cell conductors connect. Each terminal ($G_1$, $G_2$ and L) is available in both the upper and lower rows of pin pads to facilitate wiring among the cells of an IC. An upper or $V_1$ power bus 122 and a lower or $V_2$ power bus 124 both extend horizontally across the cell. These buses are metal. In this CMOS-SOS embodiment of the NOR gate 10 the voltage $V_1$ may preferably be a positive voltage such as +5 volts and the voltage $V_2$ may preferably be a more negative voltage such as ground. The electrically insulating substrate of the various structures is omitted from FIGS. 2–8 for clarity. In cell 110, the gates of transistors $T_1$ and $T_3$ comprise a poly line which extends from upper pin pad $G_1$ to the lower pin pad $G_1$. In a similar manner the gates of transistors $T_2$ and $T_4$ are a poly line extending from upper pin pad $G_2$ to lower pin pad $G_2$. Each poly gate line 130 in FIG. 2 comprises a series of connected segments which may include a plurality of straight, vertically extending segments 132, horizontally offsetting segments 134 and diagonally offsetting segments 136. Segments 132 are the primary active portions of the gates. Segments 134 and 136 are largely inactive because of the wide channel thereunder caused by the offsetting of the channel. The two PMOS transistors $T_1$ and $T_2$ are formed in an at least nominally monocrystalline P+ upper (in the FIGURES) epitaxial silicon (epi) region 142. The two NMOS transistors $T_3$ and $T_4$ are formed in an at least nominally monocrystalline N+ lower (in the FIGURES) epitaxial silicon region 144.

Regions 152 and 154 of polycrystalline material extend from the output pin pads L inward toward the epitaxial regions. These poly regions are connected to the adjacent epi regions by metallic conductors 162 and 164 in combination with metal-to-poly contacts 172 and metal-to-epi contacts 174. Other metal-to-epi contacts connect (1) power bus 122 to source $S_1$ of transistor $T_1$ and (2) power bus 124 to the common source ($S_4$–$S_3$) of transistors $T_3$ and $T_4$.

Three contacts are shown between the bus 122 and the underlying silicon. This is for processing with a system which restricts the size of each individual contact region. For a processing system without such restrictions, a single, larger contact region encompassing those contact areas may be substituted for the three small contact regions. A metallic conductor 166 connects the drain $D_2$ of transistor $T_2$ to the drains $D_3$ and $D_4$ of transistors $T_3$ and $T_4$, respectively, via metal-to-epi contacts 174.

Figure 3:
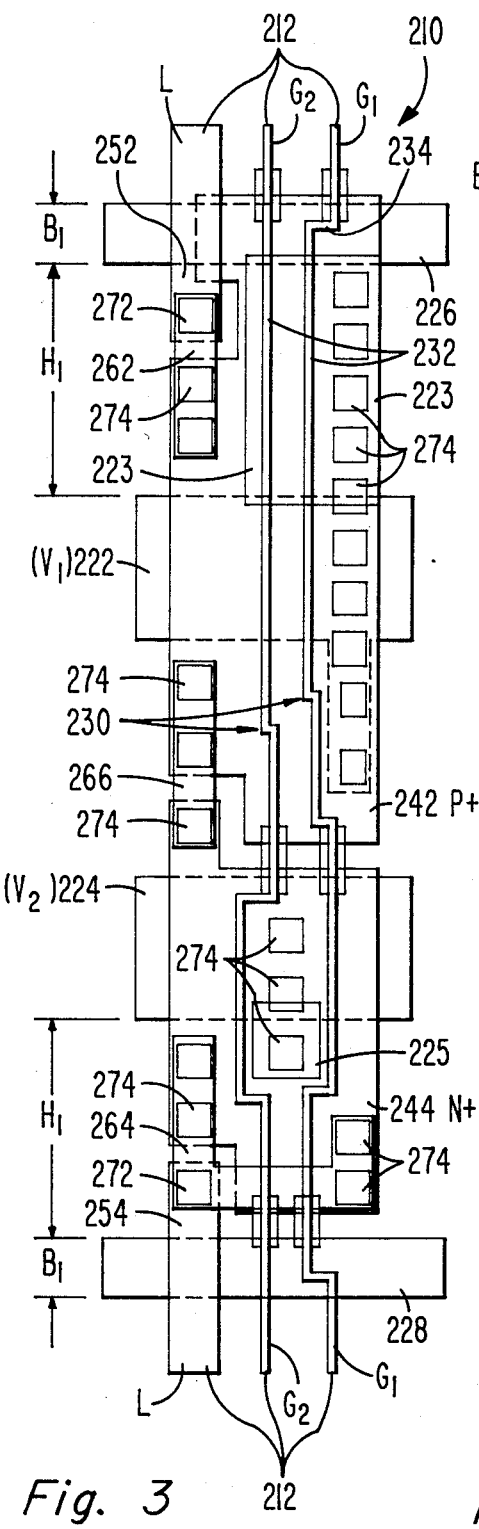
FIG. 3 illustrates a two-input NOR gate cell in accordance with the present invention.

In FIG. 3 a NOR gate cell 210 in accordance with the invention is illustrated in check plot form. In many respects, the cells 210 and 110 are identical because they are both CMOS-SOS cells and cell 210 embodies the same NOR gate 10 schematic diagram as the cell 110. Corresponding structures in these cells will be referred to by corresponding reference numerals with the reference numerals for the cell 210 being in the 200's rather than in the 100's. The discussion of cell 210 is primarily with respect to the differences between it and cell 110. In cell 210 the gate regions 230 have only straight segments 232 and horizontally offsetting segments 234 (there are no diagonally offsetting segments like segments 136 in cell 110). The absence of diagonally offsetting segments in cell 210 simplifies stretching the active devices of the cell—this is discussed hereinafter. Two power buses 222 and 224 in cell 210 are similar to the power buses 122 and 124 of the cell 110. Cell 210 has an additional upper power bus segment 226 and an additional lower power bus segment 228. Each of these segments has a width $B_1$. The power buses 222 and 224 may be referred to as inner power buses and the power buses 226 and 228 may be referred to as outer power buses. The two upper power buses 222 and 226 are spaced apart a distance $H_1$ and together comprise what will be referred to as a split power bus for providing the more positive voltage $V_1$. In a similar manner the two lower power buses 224 and 228 are spaced apart a distance $H_1$ and together comprise a split lower power bus for providing the more negative voltage $V_2$. All of these bus segments are metal.

In cell 210, the functions of the metallic conductor 166 of cell 110 are divided between two conductors 264 and 266. The conductor 266 connects the drain $D_2$ of transistor $T_2$ to the drain $D_4$ of transistor $T_4$. The drain $D_3$ of transistor $T_3$ is connected to the drain $D_4$ of transistor $T_4$ by an extension of the conductor 264 which connects drain $D_4$ to poly conductor 254.

Within cell 210 the two segments 222 and 226 of the upper split power bus are connected together by a metallic strap 223. This strap serves to equalize the voltage on these bus segments and to allow current transfer from the outer segment 226 to the inner segment 222 and thus to the transistors which are connected to that power bus. It also provides additional bus-to-source $S_1$ contact area. Strap 223 is shown as a separate strap which overlaps both buses 222 and 226. In actual fabrication of the IC a single continuous region of retained metal is defined by the metal definition mask which includes both buses and the strap. In other types of cells, there may be no strap in order to prevent short circuits.

Within cell 210 no such metal strap connects segments 224 and 228 of the lower split bus because in this single-metal-layer cell the conductor 264 blocks any metallic connection between the lower bus segments. Thus, inclusion of a metal strap would create a short circuit. In an IC, metal strap connections between the lower bus segments 224 and 228 may be provided by other types of logic cells which include such straps. If many cells in succession in a cell row lack such straps, then "strap" cells providing straps connecting the split bus portions may be included in that portion of the row as needed. A short strap 225 extends from bus segment 224 toward bus segment 228 to provide extra contact area between bus segment 224 and the portion of epi region 244 which comprises the common source of transistors $T_3$ and $T_4$. The cell 210 differs from the prior art cell 110 in that (1) there are no diagonal offsets in the polycrystalline material of the gates and (2) the outer bus segments 226 and 228 are present.

Figure 4:
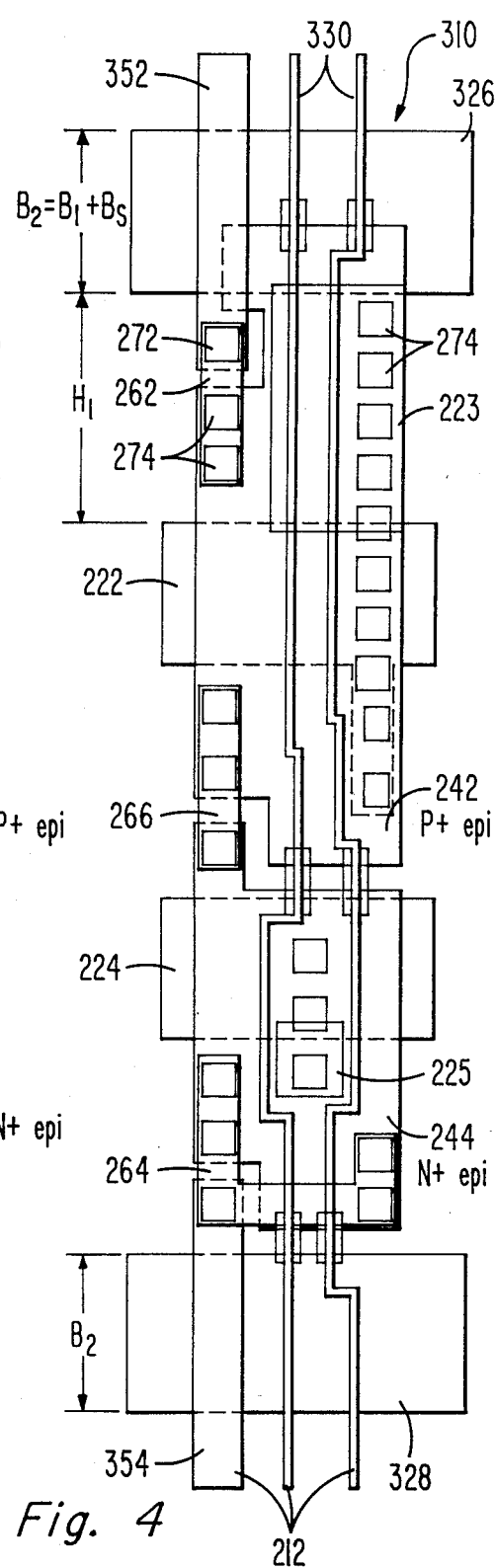
FIGS. 4–8 illustrate different modifications, in accordance with the invention of the cell of FIG. 3.

FIG. 4 illustrates a cell 310 which is a stretched version of cell 210. In many respects, the cells 210 and 310 are identical. The identical portions of their structures are identified by the same reference numerals in both cells 210 and 310. Corresponding but non-identical structures in the two cells are referred to by corresponding reference numerals with the reference numerals for the cell 310 being in the 300's rather than in the 200's. This same convention for reference numerals—using numerals in the same century as the cell number for modified structures will also be used in FIGS. 5-8. The primary difference between the cells 310 and 210 is that in cell 310 the outer power bus segments 326 and 328 each have a width $B_2$ which is greater by a width $B_S$ in cell 310 than the width of the corresponding power bus segments 226 and 228 in cell 210. Other changes such as lengthened poly regions 352 and 354 and lengthened gate region poly lines 330 follow from the stretching of the cell. The contact pin pads along the upper boundary of cell 310 are spaced from the inner upper power bus segment 222 by a distance which is $B_S$ greater than the corresponding spacing in the cell 210. A similar increased pin pad-to-inner-segment-bus spacing is present in the lower portion of the cell 310.

The cell 310 is illustrative of the modification which is made in the cells of an IC chip where the performance of the IC would be limited by excessive voltage drops on the row power bus structure, if the IC were constructed with cells 210. The widening of the outer power buses reduces the effective resistance of the row power buses and thereby reduces the voltage drops along the row power buses for a given current level.

Widening of the outer bus segments 226 and 228 is a simple process since the outer edge of each of these bus segments is outside all contacts to any underlying device structures. Thus only the terminals 212 need to be moved outward to accommodate this widening. This is true of all cells in the cell family, not just the NOR gate cell 210.

In contrast, if one attempts to widen the inner bus segments 222 and 224 of cell 210 or the buses 122 and 124 of prior art cell 110, then consideration and modification of the detailed structure of the cell is required in order to avoid introducing short circuits and other problems.

It would be possible to increase the width of the buses 122 and 124 in the prior art cell 110 by stretching the entire cell by the desired percentage. However, that would not solve the problem of excessive voltage drops on the power buses since the active devices would also be stretched, thereby increasing their current requirements.

Figure 5:
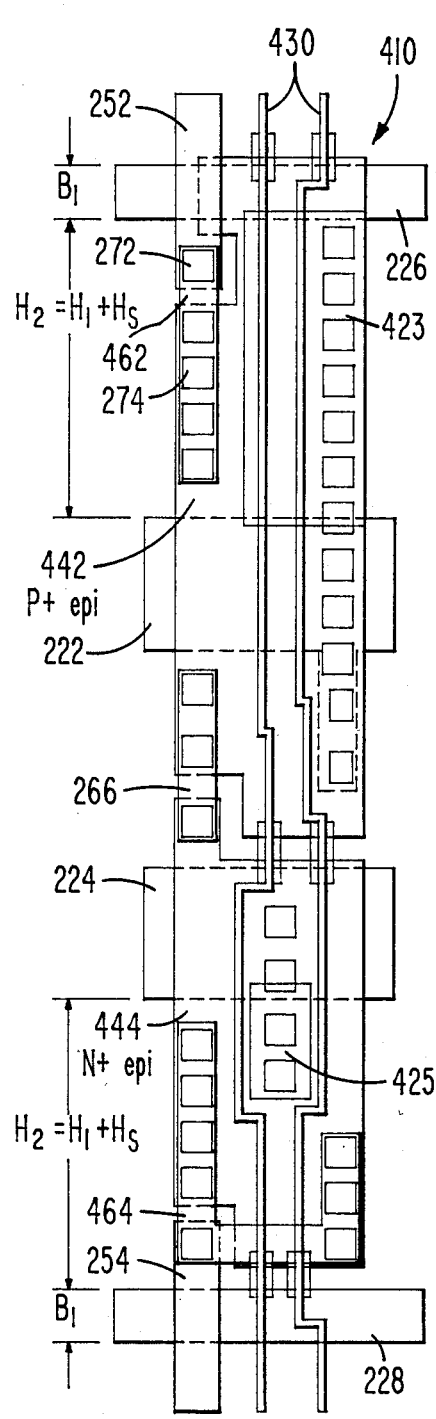

FIG. 5 illustrates a cell 410 which is a stretched version of cell 210. The primary difference between cell 410 and cell 210 is that the separation between the inner and outer power bus segments has been increased to $H_2$—an increase of $H_S$. The vertical (in the FIGURES) dimension of the epitaxial regions 442 and 444 have also been increased by a distance $H_S$. This increases the width of the transistors $T_1$, $T_2$, $T_3$ and $T_4$ by the stretch $H_S$. The greater width of these transistors in cell 410 reduces the resistance of their channels thereby increasing their current carrying capacity. The number of metal-to-epi contacts between (1) the conductors 462 and 464 and the underlying epitaxial material and (2) the inner power bus segments and their underlying epitaxial material is increased in cell 410 over those present in cell 210. The increased bus-to-epi contact is enabled by use of stretched straps 423 and 425. This increase in contact area is to obtain source-to-drain current-path lengths in the added portions of the device widths which are similar to those in the original portions of the device widths. This achieves the full increase in current carrying capacity which the stretching of these devices makes possible.

The cell 410 is illustrative of the modifications made to the cells in an IC in which the performance of the IC is limited by the current carrying capacity of the IC's transistors. This limitation affects the cell operation via a limitation on the amplitude of transient currents, rather than steady state currents. That situation typically occurs where the RC time constants within a chip are too long and the resistance of the transistor channels with the transistors in their on state is a significant contributor to the resistance in the RC circuit. The time constants of these RC circuits can be reduced by reducing the resistance of the transistor channels thereby increasing their current carrying capacity and providing a faster charging time for the RC circuits.

In the cell 410, the portion of the cell between the inner power bus segments 222 and 224 remains the same as in cell 210 as does the separation between those bus segments. This convention applies to all cell modifications in this specification and simplifies the cell design process. However, other conventions may be utilized while still providing the stretchability of the cell.

Figure 6:
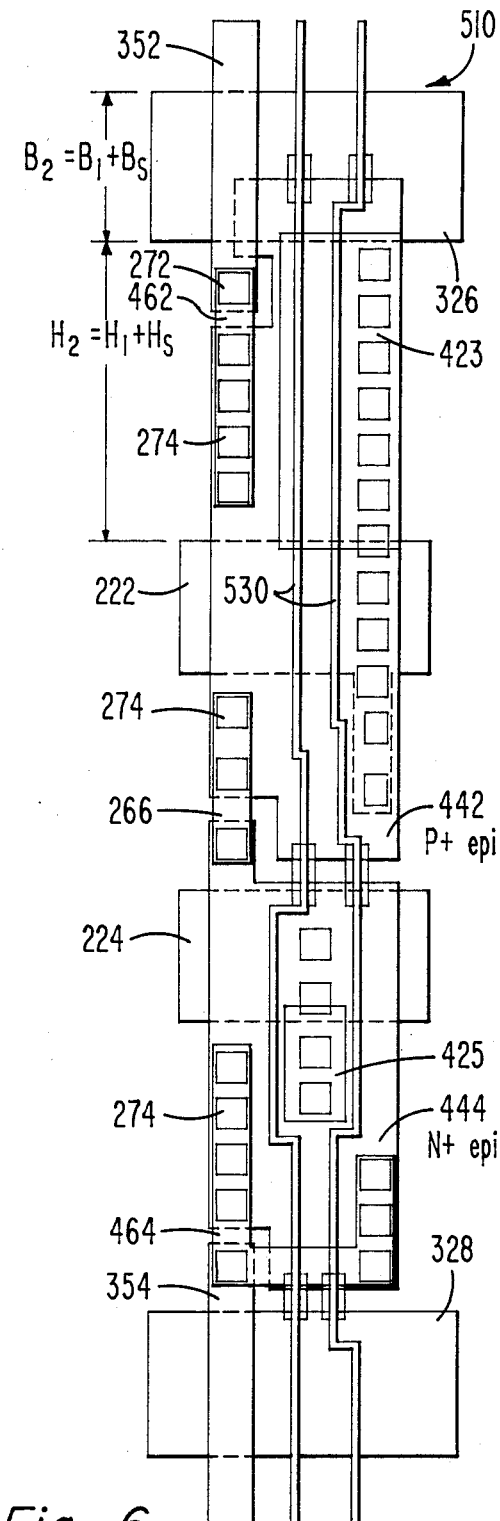

FIG. 6 illustrates a cell 510 which is a stretched version of cell 210 which includes a stretch $B_S$ in the outer bus segments and a stretch $H_S$ in the epi-regions and transistor widths. Inner buses 222 and 224 retain their fixed spacing. Cell 510 is illustrative of the modifications made in the cells of an IC whose performance is limited both by power bus voltage drop and transistor transient current carrying capacity.

Figures 7, 8:
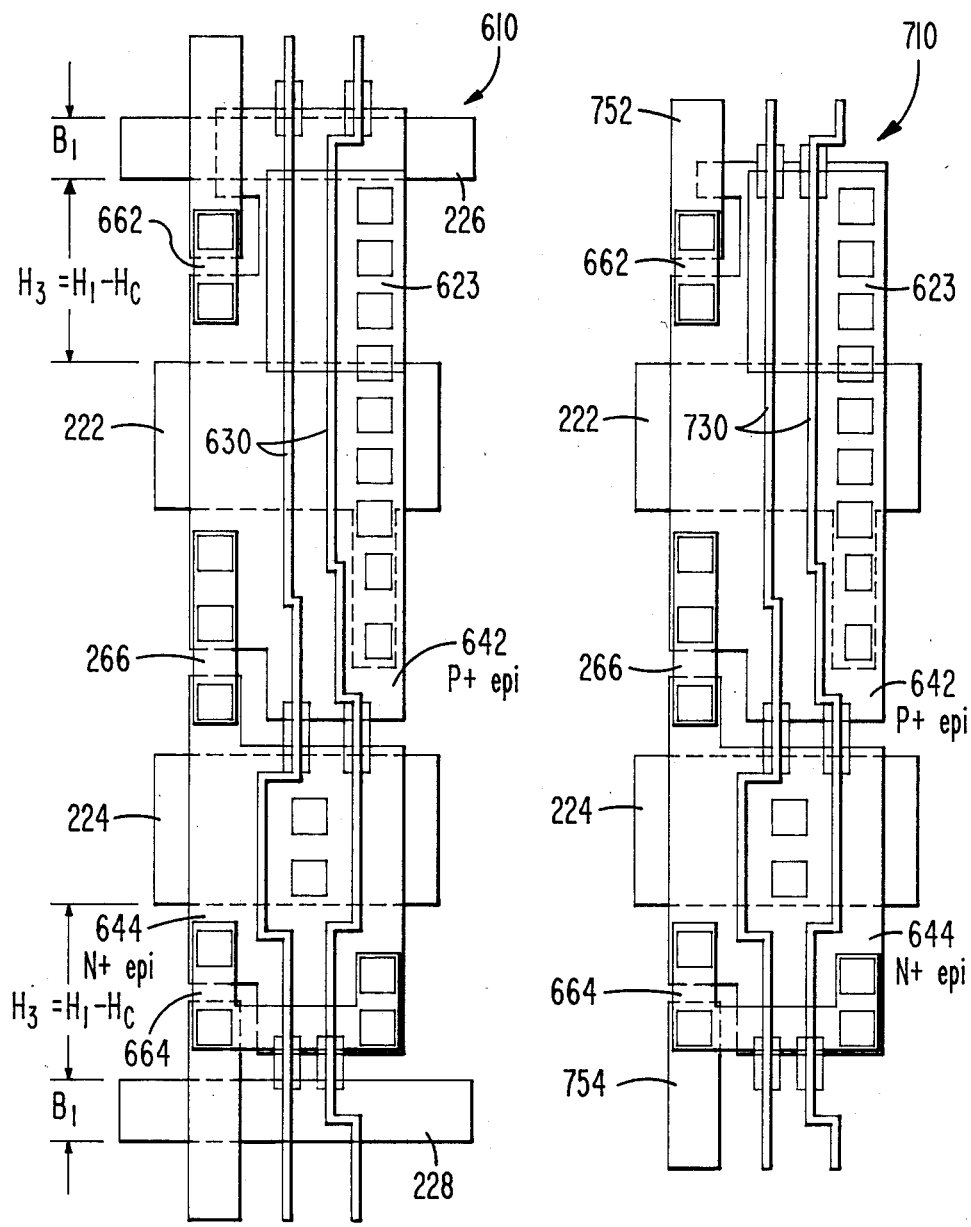

FIG. 7 illustrates a cell 610 which is a contracted version of cell 210 and which is similar to cell 210 except that the separation $H_3$ between each inner power bus segment and its associated outer power bus segment is less than in cell 210 by an amount $H_C$. The epitaxial regions 642 and 644 are also contracted by an amount $H_C$. Strap 623 is shorter than strap 223 by a distance $H_C$ and there is no strap corresponding to strap 225. This contraction of the cell reduces the current carrying capacity of the transistors and reduces the amplitude of signal current transients, and the area and the power consumption of the cell. Rather than viewing cell 610 in FIG. 7 as a contracted version of a design of which cell 210 is the nominal version, cell 610 could be viewed as the nominal version of the design with cells 210, 310, 410 and 510 viewed as stretched versions of that cell with cells 210, 310, 410 and 510 having different degrees of stretching.

The outer power bus segments may have their width reduced in accordance with the relationship between the current carrying capacity of the combined split bus and the current carrying requirement for the bus. In general, this will only be the case where the cell rows in the IC are relatively short. Cell 710 illustrated in FIG. 8 is another contracted version of cell 210 which is similar to the cell 610 except that there are no outer power bus segments and all power is supplied to the cell by the inner buses 222 and 224. This is a limiting case of reducing the width of the outer bus segments because of unneeded current carrying capacity. This omission of the outer power buses is possible in case of substantial overdesign of the bus for that IC.

FIG. 9A illustrates a portion of the right-hand part of an IC chip 800 comprising parallel, horizontally extending, rows 802 of contracted cells 610. The rows 802 are spaced apart vertically by wiring corridors 804 in which the electrically insulating substrate 801 of this SOS structure may be exposed. The split row power bus portions 222 and 226 connect to a vertically extending chip power bus 806 which is substantially wider than the row power buses. The cells within the rows are interconnected by conductive paths 805, a few of which are illustrated. Conductive paths 805 comprise vertically extending conductors on one (lower) level and horizontally extending conductors on a different (upper) level. Both levels may use metal conductors or the lower level may be polycrystalline silicon or polysilicide and the upper level metal. A layer of electrically insulating material between the conductor levels allows conductive paths to cross each other without short circuiting. Contact vias enable needed interconnections between levels.

FIG. 9B illustrates a portion of the left-hand part of an IC chip 800' which is comprised of similar cell rows 802' spaced apart by wiring corridors 804. The rows 802' are shown comprised of cells 410 which are stretched versions of the cells 210. The split row power bus portions 224 and 228 connect to a vertically extending chip power bus 808 which has the same width as chip bus 806. Because of the stretching and contraction of the cells, the height of the cell rows 802' is greater than the height of the cell rows 802. However, the height of the wiring corridors 804 in both chips are the same. These two chip portions may be different portions of the "same" IC with the FIG. 9A IC 800 being a contracted-cell version of the IC and the FIG. 9B IC 800' being a stretched-cell version of the IC. The outer buses 226 and 228 which are adjacent the wiring corridor 804 which is between the two illustrated cell rows 802 (or 802') are shown aligned in the two chips to emphasize the differing heights of the cell rows 802 and 802'.

Prior to fabricating an IC in accordance with this invention it is preferable to simulate the performance of the IC and stretch cells if the performance is inadequate or contract cells if the performance is excessive. This modification is preferably based on a narrow tolerance band about the desired performance in order to maximize the chances that the IC, when fabricated, will be within a specified tolerance of its desired performance (normally a wider band of tolerance). Following the modification, the simulation is preferably re-run. Once the simulated performance is within the specified tolerance of the desired performance, a test IC is fabricated. If the test IC's performance is outside a specified tolerance band about its desired performance, then its design is modified by stretching or contracting cells and another test IC is fabricated. Once the desired performance is obtained, production chips are fabricated.

One major advantage of utilizing the techniques of this invention to adjust the performance of an IC is that no redesign of the IC itself is required. Thus, none of the effort expended (whether by hand design or computerized design) in the cell placement process is wasted and no duplication of this effort is required. Similarly, no redesign of the cells is required if they were initially designed for modifiability or if they have been recharacterized to include modifiability information. Rather than involving redesigns, the performance is modified by adjusting the cells in a straight forward manner which may be done automatically by a computerized design system. These adjustments leave the external connection configuration of the cells unchanged, although the height of cell rows may be changed in the process. Since no change in the relative positions of individual pin pads takes place no redesign of the connections among cells in the cell rows is required.

The description of the modification of cells in tailoring the performance of this IC has been in terms of modifying all of the cells in the entire IC. This is a preferred technique. However, where the performance problems can be isolated to less than all of the rows of cells, it is feasible to modify only those rows in which performance problems exist. This can conserve semiconductor area and provide other benefits for a given level of IC performance.

What is claimed is:

1. A semiconductor integrated circuit (IC) comprising:
   a plurality of parallel, first-direction-extending cell rows each comprised of a plurality of cells;
   each of said plurality of cells including active semiconductor devices;
   a plurality of wiring corridors extending parallel to said cell rows, interleaved with said cell rows and spacing said cell rows apart in a second direction perpendicular to said first direction, said wiring corridors being substantially free of active devices and containing conductors which interconnect various ones of said cells to form the logic circuit of said IC, said cell rows themselves being free of such wiring corridors;
   each of said cell rows having a first first-direction-extending power bus for providing power to said active devices within the cells of said row, said first power bus having first and second substantially parallel segments each extending along said cell row in said first direction and spaced from each other in said second direction and connected to a first common supply bus, at least said first segment overlying some of said active devices within said cell row;
   each of said cell rows having a second first-direction-extending power bus for providing power to said active devices within the cells of said row, said second power bus having first and second substantially parallel segments each extending along said cell row in said first direction and spaced from each other in said second direction and connected to a second common supply bus, at least said first segment of said second power bus overlying said active devices within said cell row; and wherein
   all of the within-the-cell contacts to active devices in each of said cell rows are located between said second segment of said first bus and said second segment of said second bus.

2. The IC recited in claim 1 wherein within each of said cell rows:
   said first and second segments of said first power bus are connected to each other at some locations; and
   said first and second segments of said second power bus are connected to each other at some locations.

3. The IC recited in claim 1, wherein within each of said cell rows:
   said first segment of said first power bus is between said second segment of said first power bus and both segments of said second power bus; and
   said first segment of said second bus is between said second segment of said second power bus and both segments of said first bus.

4. The IC recited in claim 3 wherein:
   in each cell, said first segment of said first bus and said first segment of said second bus are spaced apart by a central portion of said cell.

* * * * *